United States Patent [19]
Magnotta et al.

[11] 3,861,917
[45] Jan. 21, 1975

[54] CONTINUOUS TONE LITHOGRAPHIC PLATE AND METHOD OF MAKING

[75] Inventors: Frank Magnotta, Laurel; Arthur D. Ketley; Suzanne E. Matheson, both of Columbia, all of Md.

[73] Assignee: W. R. Grace & Co., Columbia, Md.

[22] Filed: Aug. 3, 1973

[21] Appl. No.: 385,261

Related U.S. Application Data

[63] Continuation-in-part of Ser. No. 228,277, Feb. 22, 1972, abandoned.

[52] U.S. Cl. ...................... 96/33, 96/35.1, 96/86 R, 96/86 P, 96/115 R, 96/115 P, 204/129.1
[51] Int. Cl. .......................... G03f 7/02, B23p 1/20
[58] Field of Search .......... 96/35.1, 33, 86 P, 115 P, 96/115 R, 86 R; 204/129.1

[56] References Cited

UNITED STATES PATENTS

| | | | |
|---|---|---|---|
| 3,282,208 | 11/1966 | Ruderman | 96/33 X |
| 3,511,661 | 5/1970 | Rauner et al. | 96/33 X |
| 3,615,450 | 10/1971 | Werber et al. | 96/35.1 |
| 3,627,529 | 12/1971 | Frank et al. | 96/33 |
| 3,767,398 | 10/1973 | Morgan | 96/35.1 X |

OTHER PUBLICATIONS

A. Kenneth Graham, et al., Electroplating Engineering Handbook, Second Edition, 1962, pp. 437–38. Reinhold, N.Y.

*Primary Examiner*—Norman G. Torchin
*Assistant Examiner*—Alfonso T. SuroPico
*Attorney, Agent, or Firm*—Richard P. Plunkett; Kenneth E. Prince

[57] ABSTRACT

This invention relates to a continuous tone lithographic printing plate comprising a treated anodized aluminum surface having thereon an ink-receptive, image-forming layer of a photosensitive composition capable of forming photographic films that can be exposed and processed to give images having a gamma in the range 0.3-2.5.

6 Claims, No Drawings

CONTINUOUS TONE LITHOGRAPHIC PLATE AND METHOD OF MAKING

This application is a continuation-in-part of copending application having Ser. No. 228,277, filed Feb. 22, 1972, assigned to the same assignee and now abandoned.

This invention relates to a process for preparing a lithographic printing plate which contains a continuous tone image upon a support layer. The lithographic printing plate is prepared from a photosensitive element which includes a sealed anodized aluminum support and a contiguous layer containing a photosensitive composition. The process itself involves image wise exposing the layer containing the photosensitive composition to ultraviolet radiation through a continuous-tone, image-bearing transparency whereby the exposed areas of the photosensitive layer are hardened to an insoluble state. The unexposed photosensitive composition is removed from the support layer by any convenient method, such as, rinsing the plate in a suitable solvent. The resultant lithographic printing plate capable of reproducing a continuous tone image can be placed upon a lithographic press and used to print a substantial number of copies. During said printing process the hydrophilic surfaces of the plate are wetted with water or a fountain solution and the oleophylic surfaces of the photosensitive composition are inked with a suitable ink, such as, the standard lithographic inks.

Among other advantages, the continuous tone lithography of this invention has the following advantages over conventional half tone lithography:

1. Ability to resolve finer detail;
2. Eliminates Moire — effects caused by interference between (a) superimposed half tone patterns and (b) subject and half tone patterns;
3. Ability to produce a higher saturation of pastel colors; and
4. Eliminates the halftone step.

Half-toning has always represented a necessary evil to printers because it forces them to add an extra step to the reproduction system that not only degrades and limits the quality of the reproduction but also requires time and specialized materials and equipment.

It is a great advantage of this invention that reproduction of continuous-tone images is achieved without half tone photography. This fact is of particular importance in full-color printing.

The continuous tone printing plates of this invention can also be used to print full-color (i.e., several colors) images by use of a lithographic printing press.

However, it has been found that the continuous tone effect can be obtained on a suitably grained and anodized aluminum surface. By "suitably grained," is meant one that has a wide, random distribution of grain depths or grain pores. If it is assumed that only grain pores that have essentially no solubilized polymer in them remain on the plate then the number of pores containing insolubilized polymer depends on the intensity of light striking a given area. In order to adhere polymer in this fashion to give continuous tones, the surface must be suitably anodized and sealed to form bohemite structures over the anodic pores. The photosensitive materials must have properties such that when they are used as photosensitive layers on transparent supports to give photographic films, these films may be exposed and processed to give images having relatively low values of gamma i.e. 0.3–2.5. When carried out in the above manner, lithographic printing plates have been made which show 7 to 10 or more distinct steps from a 21 step gray scale. This is entirely suitable for true continuous tone reproduction purposes.

BACKGROUND OF THE INVENTION

1. Objectives of the Invention

It is an object of this invention to provide a new and improved lithographic surface having the capability of reproducing a continuous tone image. Another object is to provide such a lithographic surface that is easy to make and has a long image life. A further object is to provide such a lithographic surface which is easily produced by photo-insolubilizing a photosensitive composition. Still further objects will be apparent from the following description of this invention.

2. The Prior Art

In lithographic printing, the printing surface itself does not have any appreciable relief depth or depression or may be planographic. The general principle upon which lithographic printing is based involves the making of a printing image, which is relatively ink receptive (or oleophilic), on a background surface which is comparatively water receptive (or hydrophilic). In general, lithography involves moistening of the nonimage areas of the plate with water or a fountain solution which is normally water-containing, to block the ink from the nonimage areas, inking the image areas by some convenient means, such as, rollers, and then transferring the ink to a receiving surface, such as, paper. The ink transfer is usually done by means of the application of pressure to the image-bearing lithographic plate. The two most common means of lithographic printing are direct rotary and offset rotary lithography. Within the scope of this invention, the term lithography will be used in a sense which is broader than that normally used in the lithographic printing arts. Therefore, lithography is defined within the scope of this invention as printing from a printing surface which does not have any appreciable relief depth (about 4 mils or less).

Original continuous-tone images are usually converted into printable images for relief, planographic, and porous printing, as well as for certain gravure methods, by half-tone photography. The conversion of a picture into a pattern of dots (halftone image) degrades the image and introduces problems in the reproduction process. One example of image degradation is the inability of a halftone to resolve the fine details in a picture because the dot structure is larger than the fine detail. Another example of degradation is experienced in color reproduction when pastel colors in originals (which are always continuous tone) usually turn out grayer or less saturated in the halftone structure and can be demonstrated by exposing both continuous and halftone scales onto a photographic color film. The continuous tone highlight steps will have higher saturation than the halftone even though they are matched for lightness and produced by the same dyes.

Collotype printing cannot approach the reproduction of continuous-tone images along the lines of ink control alone. In printing, the image carrier must be endowed with such characteristics as are needed to produce printed images of the desired quality. In all relief methods, in lithography and in porous (e.g., screen) printing, the reproductions of continuous-tone images consist of systematic, not regular dot patterns. Collotype and the most frequently used gravure method apply ink films of graduated thickness, but there are also gravure methods that can apply ink films of uniform thickness.

Collotype, also known as photogelatin, is the oldest planographic printing method completely based on photomechanics. The Collotype plate consists of a differentially light-hardened "image" that picks up ink in direct proportion to the degree of hardening of the gelatin.

The most distinctive technical feature of collotype is that it is capable of reproducing continuous-tone images without halftone photography. Collotype is usually done by direct printing. The image carrier is a metal or glass sheet coated with a formula of bichromated gelatin suitable for photomechanical image formation. Collotype is not suitable for long-run printing as the paper abrades the image carrier with which it is in direct contact during each impression. This abrasion limits the useful life of collotype plates to approximately 5,000 impressions.

Several other continuous tone printing processes are known, but those processes have several disadvantages, besides generally having a plate life which is limited to about 20,000, or fewer, impressions per plate. For example, mezzotint screens are rather coarse and are used only for special effects. Known continuous tone printing processes are critical and unpredictable.

Thus due to the nature of the printing process, continuous tone reproduction in the manner of silver type films and papers has previously been impossible to obtain since increasing the thickness of polymer on the plate would have no effect whatever on the printing.

DETAILED DESCRIPTION OF THE INVENTION

In lithographic printing, one surface, normally the images surface, is oleophilic (water repellent). The other surface, usually a slightly recessed surface, is hydrophilic (ink repellent). The properties are relative in the sense that one surface, in relation to another surface, is relatively water repellent or relatively ink repellent or relatively oleophilic or hydrophilic. In short, this means there is no absolute scale upon which to base saying one surface is oleophilic or hydrophilic. In the instant invention, the photosensitive compositions are oleophilic in relation to the aluminum support layer. The support layer can be made more hydrophilic or ink repellent by treatment of the surface.

Another name for continuous tone lithography is screenless lithography. Screenless lithography is quite similar to conventional lithography except that pictures are reproduced without a halftone screen.

Screenless lithography is carried out on a conventional or direct offset press with conventional inks and fountain solutions. Although screenless lithography is called a continuous tone process, the printed image may be but is not necessarily limited to a continuous film of ink in size and are irregularly shaped. This grainy pattern can be seen when the continuous tone pattern is magnified. The lightness of a given tone seems to be due to the average area of a large number of ink spots that cover the paper. In all following discussions, the "continuous tone effect" will mean a grainy structure consisting of a random distribution or irregularly shaped spots of ink whose relative areas are changed to produce lighter and darker tones. Implicit in this definition of continuous tone images is the fact that no use has been made of the halftone dot technique for image reproduction.

It can generally be stated that the theory or mechanism of continuous tone printing is not entirely or clearly understood by those skilled in the art.

The crucial ingredients in the photosensitive material are either: (A) a conventional photosensitive diazo material or, (B) a photocurable composition consisting essentially of:

1. 2 to 98 parts by weight of an ethylenically unsaturated polyene containing two or more reactive unsaturated carbon to carbon bonds per molecule;

2. 98 to 2 parts by weight of a polythiol containing at least 2 thiol groups per molecule; the total combined functionality of the carbon to carbon bonds per molecule in the polyene and thiol groups per molecule in the polythiol being greater than 4; and 3. 0.0005 to 50 parts by weight of a photocuring rate accelerator based upon 100 parts by weight of (1) and (2) above. (Preferred range of accelerator is about 0.005 to about 30 parts by weight).

The reactive carbon to carbon bonds of the polyenes are preferably located terminally, near terminally, and/or pendant from the main chain. The polythiols used herein contain two or more thiol groups per molecule.

The ink-receptive photocurable compositions used herein can be liquids or solids. If a solid is used it is usually applied to the plate in a solvent which is evaporated off prior to imaging. The liquid photocurable compositions have a viscosity ranging from essentially zero to about 20 million centipoises at 130°C.

As used herein polyenes and polyynes refer to simple or complex species of alkenes or alkynes having a multiplicity i.e., at least 2, "reactive" carbon to carbon unsaturated functional groups per average molecule. For example, a diene is a polyene that has two reactive carbon to carbon double bonds per average molecule, while a diyne is a polyene that contains in its structure two reactive carbon to carbon triple bonds per average molecule. Combinations of reactive carbon bonds within the same molecule are also operable. An example of this is monovinylacetylene, which is a polyeneyne under our definition. For purposes of brevity all these classes of compounds will be referred to herein as polyenes.

As used herein the term reactive unsaturated carbon to carbon groups means groups which will react under proper conditions as set forth herein with thiol groups to yield the thioether linkage $$(-\overset{|}{\underset{|}{C}}-S-\overset{|}{\underset{|}{C}}-),$$

as contrasted to the term "unreactive" carbon to carbon unsaturation which means $$-\overset{|}{C}=\overset{|}{C}-$$

groups when found in aromatic nucleii (cyclic structures exemplified by benzene, pyridine, anthracene, and the like) which do not under the same conditions react with thiols to give thioether linkages. In the instant invention products from the reaction of polyenes with polythiols which contain 2 or more thiol groups per average molecule are called polythioether polymers or polythioethers.

Methods of preparing various polyenes useful within the scope of this invention are disclosed in U.S. Pat. No. 3,627,529 assigned to the same assignee. Some of the useful polyenes are prepared in the detailed examples, set forth in the following specification.

One group of polyene compositions are those polyene compositions having a -ene or -yne functionality of at least two which are formed by reacting either:

A. An organic epoxide containing at least two

```
-CH-CH-
  \ /
   O
```

groups in its structure with a member of the group consisting of hydrazine, primary amines, secondary amines, tertiary amine salts, organic acids wherein said group members contain at least one organic substituent containing a reactive ethylenically or ethylynically unsaturated group; or B. An organic epoxide containing at least one organic substituent containing a reactive ethylenically or ethylynically unsaturated group with a member of the group consisting of hydrazine and an organic material containing at least two active hydrogen functions from the group consisting of

```
 H
 |    |+               |     |
-N-H, -N-H, -OH, -SH, -B-H, -P-H.
       |
```

A second group of polyenes operable in the instant invention is that taught in British Pat. No. 1,215,591 assigned to the same assignee. This group includes those having a molecular weight in the range of 50 to 20,000, a viscosity ranging from 0 to 20 million centipoises at 70°C. of the general formula: $[A]\!\!-\!\!(X)_m$ wherein X is a member of the group consisting of

```
  | |
R-C=C-
```

$m$ is at least 2; R is independently selected from the group consisting of hydrogen, halogen, aryl, substituted aryl, cycloalkyl, substituted cycloalkyl, aralkyl, substituted aralkyl and alkyl and substituted alkyl groups containing 1 to 16 carbon atoms and A is a polyvalent organic moiety free of (1) reactive carbon to carbon unsaturation and (2) unsaturated groups in conjugation with the reactive ene or yne groups of X. Thus A may contain cyclic groupings and minor amounts of hetero atoms such as N, S, P or O but contains primarily carbon-carbon, carbon-oxygen or silicon-oxygen containing chain linkages without any reactive carbon to carbon unsaturation.

In this second group, the polyenes are simple or complex species of alkenes or alkyenes having a multiplicity of pendant, terminally or near terminally positioned reactive carbon to carbon unsaturated functional groups in the molecule; whereas by "near terminal" is meant that the functional unsaturation is more than 16 carbon atoms away from an end of the main chain in the molecule. The term "pendant" means that the reactive carbon to carbon unsaturation is located terminally or near terminally in a branch of the main chain as contrasted to a position at or near the ends of the main chain. For purposes of brevity all of these positions will be referred to generally as "terminal unsaturation."

The liquid polyenes operable in this second group contain one or more of the following types of non-aromatic and non-conjugated "reactive" carbon to carbon unsaturation:

```
(1) -CH=CH-        (5) -C=C-   (with single bonds on each C)
(2) -C≡C-          (6) -C=CH-  (with single bond on C)
(3) -CH=CH2        (7) -CH=C-  (with single bond on C)
(4) -C≡CH          (8) -C=CH2  (with single bond on C)
```

These functional groups as shown in 1–8 supra are situated in a position either which is pendant, terminal or near terminal with respect to the main chain but are free of ternal conjugation. As used herein the phrase "free of terminal conjugation" means that the terminal reactive unsaturated groupings may not be linked directly to non-reactive unsaturated species such as

```
            O
            ||      |
-C-,      -S-,    -P-
 ||         ||      ||
 O          O       O
```

and the like so as to from a conjugated system of unsaturated bonds exemplified by the following structure:

```
R-C=C-C-, etc.
  | | ||
  R R O
```

etc. On the average the polyenes must contain 2 or more reactive unsaturated carbon to carbon bonds/molecule and have a viscosity in the range from slightly above 0 to about 20 million centipoises at 70°C. Included in the term "polyenes" as used herein are those materials which in the presence of an inert solvent, aqueous dispersion of plasticizer fall within the viscosity range set out above at 70°C. Operable polyenes in the instant invention have molecular weights in the range of about 50 to about 20,000, preferably about 500 to about 10,000.

Examples of operable polyenes from this second group include, but are not limited to:

1. crotyl-terminated polyurthanes which contain two reactive double bonds per average molecule in a near terminal position of the average general formula:

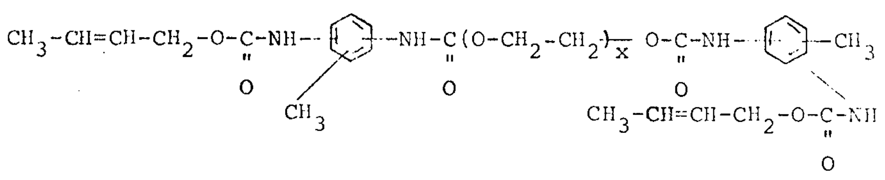

where $x$ is at least 1, 2. ethylene/propylene/non-conjugated diene terpolymers, such as "Nordel 1040" manufactured by E. I. du-Pont de Nemours and Co., Inc., which contains penper average molecule. As used herein for determining the position of the reactive functional carbon to carbon unsaturation, the term "terminal" means that said functional unsaturation is at an end of the main chain dant reactive double bonds of the formula: $-CH_2CH{=}CH-CH_3$, 3. the following structure which contains terminal reactive double bonds:

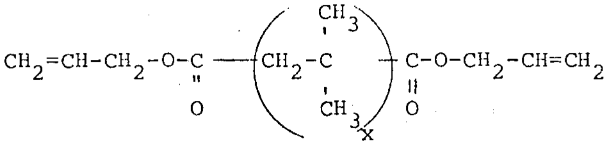

where $x$ is at least 1.

4. The following structure which contains near terminal reactive double bonds $$CH_3(CH_2)_7\text{-}CH{=}CH\text{-}(CH_2)_7\text{-}\underset{\|}{C}(O)\text{-}(OC_3H_6)_x\text{-}O\text{-}\underset{\|}{C}(O)\text{-}(CH_2)_7\text{-}CH{=}CH\text{-}(CH_2)_7CH_3$$

where $x$ is at least 1.

A third group of operable polyenes includes those unsaturated polymers in which the double or triple bonds occur primarily within the main chain of the molecules. Examples include conventional elastomers (derived primarily from standard diene monomers) such as polyisoprene, polybutadiene, styrene-butadiene rubber, isobutylene-isoprene rubber, polychloroprene, styrene-butadiene-acrylonitrile rubber and the like; unsaturated polyesters, polyamides, and polyurethanes derived from monomers containing reactive unsaturation, e.g.; adipic acid-butenediol, 1,6-hexanediamine-fumaric acid and 2,4-tolylene diisocyanate-butenediol condensation polymers and the like.

A fourth group of polyenes operable in this invention includes those polyenes in which the reactive unsaturated carbon to carbon bonds are conjugated with adjacent unsaturated groupings. Examples of operable conjugated reactive ene systems include but are not limited to the following:

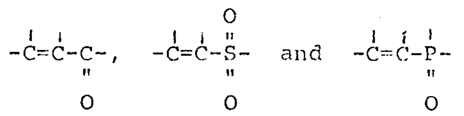

A few typical examples of polymeric polyenes which contain conjugated reactive double bond groupings such as those described above are poly(oxyethylene) glycol (600 M.W.) diacrylate, poly(oxytetramethylene) glycol (1000 M.W.) dimethylacrylate, the triacrylate of the reaction product of trimethylolpropane with 20 moles of ethylene oxide, and the like.

As used herein, the term polythiols refers to simple or complex organic compounds having a multiplicity of pendant or terminally positioned -SH functional groups per average molecule.

On the average the polythiols must contain 2 or more —SH groups/molecule. They usually have a viscosity range of slightly above 0 to about 20 million centipoises (cps) at 70°C., as measured by a Brookfield Viscometer. Included in the term "polythiols" as used herein are those materials which in the presence of an inert solvent, aqueous dispersion or plasticizer fall within the viscosity range set out above at 70°C. Operable polythiols in the instant invention usually have molecular weights in the range about 50 to about 20,000, preferably about 100 to about 10,000.

The polythiols operable in the instant invention can be exemplified by the general formula: $R_8\,(SH)_n$ where n is at least 2 and $R_8$ is a polyvalent organic moiety free from reactive carbon to carbon unsaturation. Thus $R_8$ may cotain cyclic groupings and minor amounts of hetero atoms such as N, S, P or O but primarily contains carbon-hydrogen, carbon-oxygen, or silicon-oxygen containing chain linkages free of any reactive carbon to carbon unsaturation.

One class of polythiols operable with polyenes in the instant invention to obtain essentially odorless cured polythioether printing plates are esters of thiol-containing acids of the general formula: $HS\text{—}R_9\text{—}COOH$ where $R_9$ is an organic moiety containing no reactive carbon to carbon unsaturation with polyhydroxy compounds of the general structure: $R_{10}\text{—}(OH)_n$ where $R_{10}$ is an organic moiety containing no reactive carbon to carbon unsaturation and $n$ is 2 or greater. These components will react under suitable conditions to give a polythiol having the general formula:

$$R_{10}\text{——}(\underset{\|}{OC}(O)\text{-}R_9\text{-}SH)_n$$

where $R_9$ and $R_{10}$ are organic moieties containing no reactive carbon to carbon unsaturation and $n$ is 2 or greater.

Certain polythiols such as the aliphatic monomeric polythiols (ethane dithiol, hexamethylene dithiol, decamethylene dithiol, tolylene-2,4-dithiol, etc.) and some polymeric polythiols such as a thiol-terminated ethylcyclohexyl dimercaptan polymer, etc. and similar polythiols which are conveniently and ordinarily synthesized a commercial basis, although having obnoxius odors, are operable in this invention. Examples of the polythiol compounds preferred for this invention because of their relatively low odor level and fast curing rate include but are not limited to esters of thioglycolic acid ($HS\text{—}CH_2COOH$), α-mercaptopropionic acid ($HS\text{—}CH(CH_3)\text{—}COOH$) and β-mercaptopropionic acid ($HS\text{—}CH_2CH_2COOH$) with polyhydroxy compounds such as glycols, triols, tetraols, pentaols, hexaols, etc. Specific examples of the preferred polythiols include but are not limited to ethylene glycol bis(thioglycolate), ethylene glycol bis (β-mercaptopropionate), trimethylolpropane tris (β-mercaptopropionate), pentaerythritol tetrakis (thioglycolate) and pentaerythritol tetrakis (β-mercaptopropionate), all of which are commercially available. A specific example of a preferred polymeric polythiol is polypropylene ether glycol bis (β-mercaptopropionate) which is prepared from polypropylene-ether glycol (e.g., Pluracol P2010, Wyandotte Chemical Corp.) and β-mercaptopropionic acid by esterification.

The preferred polythiol compounds are characterized by a low level of mercaptan-like odor initially, and after reaction, give essentially odorless cured polythioether end products which are commercially useful resins or elastomers for printing plates.

As used herein the term "odorless" means the substantial absence of the well-known offensive and sometimes obnoxious odors that are characteristic of hydrogen sulfide and the derivative family of compounds known as mercaptans.

The term "functionality" as used herein refers to the average number of ene or thiol groups per molecule in the polyene or polythiol, respectively. For example, a triene is a polyene with an average of three reactive carbon to carbon unsaturated groups per molecule and thus has a functionality (f) of three. A dithiol is a polythiol with an average of two thiol groups per molecule and thus has a functionality (f) of two.

It is further understood and implied in the above definitions that in these systems, the functionality of the polyene and the polythiol component is commonly expressed in whole numbers although in practice the actual functionality may be fractional. For example, a polyene component having a nominal functionality of 2 (from theoretical considerations alone) may in fact have an effective functionality of somewhat less than 2. In an attempted synthesis of a diene from a glycol in which the reaction proceeds to 100 percent of the theoretical value for complete reaction, the functionality (assuming 100 percent pure starting materials) would be 2.0. If, however, the reaction were carried to only 95 percent of theory for complete reaction, about 10 percent of the molecules present would have only one ene functional group, and there may be a trace of material that would have no ene functional groups at all. Approximately 90 percent of the molecules, however, would have the desired diene structure and the product as a whole then would have an actual functionality of 1.9. Such a product is useful in the instant invention and is referred to herein as having a functionality of 2.

The aforesaid polyenes and polythiols can, if desired, be formed or generated in situ and still fall within the scope of the instant invention.

The photosensitive material is usually applied to yield a coating layer containing 10 to 150 mg./ft.$^2$ To obtain the maximum strength, solvent resistance, creep resistance, heat resistance and freedom from tackiness, the reaction components consisting of the polyenes and polythiols of this invention generally are formulated in such a manner as to give solid, crosslinked, three dimensional network polythioether polymer systems on curing. In order to achieve sucn infinite network formation, the individual polyenes and polythiols must each have a functionality of at least 2 and the sum of the functionalities of the polyene and polythiol components must always be greater than 4. Blends and mixtures of the polyenes and the polythiols containing said functionality are also operable herein.

In general, it is preferred, especially at or near the operable lower limits of functionality in the polyene and polythiol, to use the polythiol and the polyene compounds in such amounts that there is one thiol group present for each double bond, it being understood that the total functionality of the system must be greater than four, and the functionality of the thiol and the diene must each be at least two. For example, if two moles of a triene are used, and a dithiol is used as the curing agent, making the total functionality have a value of five, it is preferable to use three moles of the dithiol. If much less than this amount of the thiol is used, the curing rate will be lower and the product will be weaker because of the reduced crosslink density. If much more than the stoichiometric amount of the thiol is used, the rate of cure may be higher, if that is desirable, although excessive amounts can lead to a plasticized crosslinked product which may not have the desired properties. However, it is within the scope of this invention to adjust the relative amounts of polyenes and polythiols to any values above the minimum scope disclosed herein which give desirable properties to the cured polythioether.

The photosensitive compositions of this invention can be modified so that relatively oleophilic materials, such as, stearic acid, are present in the surface areas of the photoinsolubilized image areas. Other variations include using allyl stearate as a co-curable additive; using resins in the polyene which are more oleophilic in character than the bisphenol-A used to prepare epoxy type polyenes; using allyl alchol or trimethylol propane diallyl ether in place of diallyl amine to terminate the diepoxide resins, the former being the least water sensitive (hydrophilic); and using oleophilic fillers, e.g., powdered polyethylene, which are transparent to U.V. light, thereby not interferring with the photoinsolubilizing.

The photosensitive materials should be exposed to actinic radiation containing a substantial amount of ultraviolet radiation until substantial photoinsolubilizing takes place in the exposed areas.

The photo reaction can be initiated by U.V. radiation contained in actinic radiation from sunlight or obtained from special light sources which emit significant amounts of U.V. light. Thus it is possible merely to expose the polyene and polythiol admixture to actinic radiation under ambient conditions or otherwise and obtain a cured solid elastomeric or resinous product useful as image production material. But this approach to the problem results in extremely long exposure times which causes the process in the vast bulk of applications to be commercially unfeasible. Chemical photocuring rate accelerators (photoinitiators or sensitizers or activators) serve to drastically reduce the imaging exposure times and thereby when used in conjunction with various forms of energetic radiation (containing U.V. radiation) yield very rapid, commercially practical cures by the practice of the instant invention. Useful photocuring rate accelerators include benzophenone, acetophenone, acenapthene-quinone, methyl ethyl ketone, thioxanthen-9-one, xanthen-9-one, 7-H-Benz [de] anthracen-7-one, dibenzosuberone, 1-naphthaldehyde, 4,4'-bis-(dimethylamino) benzophenone, fluorene-9-one, 1'-acetonaphthone, 2'-acetonaphthone, 2,3-butanedione, anthraquinone, 1-indanone, 2-tert-butyl anthraquinone, valerophenone, hexanophenone, 8-phenylbutyrophenone, p-morpholinopropiophenone, 4-morpholinobenzophenone, 4'-morpholinoseoxybenzoin, p-diacetylbenzene, 4-aminobenzophenone, 4'-methoxyacetophenone, benzaldehyde, $\alpha$ -tetralone, 9-acetylphenanthrene, 2-acetylphenanthrene, 10-thioxanthenone, 3-acetylphenanthrene, 3-acetylindole, 1, 3, 5-triacetylbenzene, etc. and blends thereof. The photocuring rate accelerators (the third crucial ingredient) are added in an amount ranging from about 0.0005 to about 50 percent by weight of the polyene and polythiol components in the instant invention. Benzophenone is the preferred photocuring rate accelerator. Useful U.V. radiation has a wave length in the range of about 2000 to 4000 angstrom units.

The compositions to be photoinsolubilized, i.e., converted to a solid continuous tone lithographic printing plate, in accord with the present invention may, if desired, include such additives as natural or synthetic resins, antioxidants, dyes, inhibitors and activators. The photocurable polyenepolythiol compositions may also contain fillers, pigments, antistatic agents, flame-retardent agents, thickeners, thixotropic agents, surface-active agents, light scattering agents, viscosity modifiers, extending oils, plasticizers, tackifiers and the like within the scope of this invention. Such additives are usually preblended with the polyene or polythiol prior to or during the compounding step. As is the case with any material which is added to the photosensitive composition useful within the scope of this invention, one should take care that it does not affect the oleophilic or hydrophilic characteristics thereof in a manner which is undesired. Operable fillers include natural and synthetic resins, carbon black, glass fibers, wood flour, clay, alumina, carbonates, e.g., an oxide, e.g., titanium dioxide, hydroxides, silicates, glass flakes, glass beads, borates, phosphates, diatomaceous earth, calcium sulfate, a calcium carbonate, antimony oxide, colloidal carbon, titanium dioxide, various colored pigments, various organophilic silicas, powdered glass, and the like. The aforesaid additives may be present in quantities up to 500 parts or more per 100 parts photosensitive composition by weight and preferably 0.0005 to 300 parts on the same basis.

The type and concentration of additives must be selected with great care so that the final composition remains photosensitive under practical conditions of exposure and with commercially feasible time cycles maintained throughout the operation. Additives which block out the passage of U.V. light or which detract from the stability of the photosensitive composition must be avoided.

The compounding of the polyene-polythiol components prior to curing can be carried out in several ways. One useful method of compounding is to prepare by conventional mixing techniques (but in the absence of actinic radiation) a composition consisting of polyene, polythiol, U.V. sensitizer or photoinitiator, and other inert additives. This composition generally can be stored in the dark for extended periods of time. It could be charged to an aerosol can, drum, tube, or cartridge for subsequent use.

Conventional curing inhibitors or retarders operable in the instant invention include but are not limited to hydroquinone p-tert-butyl catechol; 2,6-ditert-butyl-p-methylphenol phenothiazine and N-phenyl-2-napthylamine. The majority of the commercially available monomers and polymers used in the photocurable polyene-polythiol compositions normally contain minor amounts (about 50 to 5000 parts per million by weight) of inhibitors to prevent spontaneous polymerization prior to use in making a printing plate. The presence of these inhibitors in optimum amounts causes no undesirable results in the photocurable layer of this invention.

The molecular weight of the polyenes of the instant invention can be measured by various conventional methods including solution viscosity, osmotic pressure and gel permeation chromatography. Additionally, the molecular weight can be sometimes calculated from the known molecular weight of the reactants. The viscosity of the polyenes and polythiols was measured on a Brookfield Viscometer at 30° to 70°C. in accord with the instructions thereof.

The photocurable polyene-polythiol composition at ambient temperatures can vary from a liquid to a solid state, including a gel or elastomeric state. The photocurable composition may also contain a thickening agent to increase the viscosity of the photocurable liquid polymer. For example, cellulosic derivatives, finely divided silicas, and finely ground fibrous asbestos materials may be used, but it is preferable that a filler be used which will volatilize when the cured photocurable composition is thermally decomposed. The preferred photocurable compositions of the instant invention have viscosities in the range of about 0.25 to about 350 poises and preferably from about 5 to about 150 at or below 130°C.

The coating of photosensitive composition can be rather thick but the image quality is not as good as desired in lithographic printing. Therefore, the maximum coating thickness is about 4 mil; the minimum coating thickness about 0.00001 inch; and the preferred range is about 0.0001 to 0.001 inch.

Preparing aluminum or aluminum alloy plates for lithographic continuous tone printing can be divided into three operations: graining, anodizing and sealing.

It is critical in the instant invention in order to obtain a continuous tone lithographic plate that the graining, anodizing and sealing steps all be performed and in the prescribed manner. That is, failure to grain the aluminum precludes a continuous tone image. Anodizing in a medium other than sulphuric acid under specified conditions will not result in a continuous tone image. Furthermore even if the graining and anodizing are carried out as herein stated, without partial sealing, a continuous tone image will not result.

Graining of the aluminum surface is carried out electrochemically. Electrochemical graining is critical herein since such type graining results in a random distribution of microfine grain structure over a wide range of varying depths, i.e. 1 to 15 microns. Electrochemical graining as compared to chemical graining is relatively clean and non-contaminating. The electrochemical graining should be carried out under conditions which etch the surface quickly to insure a random and wide distribution of pits. Slow etching, on the other hand, is more conducive for producing a more even grain morphology with less variation in depths.

In the instant invention electrochemical graining conditions require using 0.1 to 1.0 Baume HCl with the aluminum sheets back to back. The plate's spacing should be between 1 and 3 inches and the bath temperature should range between 15° and 36°C. The voltage during the graining step should range between 8.5 and 12 volts. At the minimum values of 0.1 Baume HCl, 3 inches between plates and 15°C employing 8.5 volts, an adequate grain is obtained in about 30 minutes having a depth ranging from 1–15 microns. It is critical in the instant invention to have a variation in depth of 1–15 microns, preferably 2–12 microns in order to obtain the continuous tone plate. Longer residence time will increase the average depth but not appreciably change the distribution limits. Upper limits on graining, i.e. 1.0 Baume HCl, 1 inch spacing between plates, a bath temperature of 36°C employing 12.0 volts for 5 minutes would result in the same operable depth range and distribution.

For the purpose of this invention we have found that chemical graining or mechanical graining, e.g. tub or ball graining, is definitely inferior to electrochemical graining and is inoperable herein since the overall grain depth is in the range of only 1–3 microns and the distribution of depth necessary for this invention does not result.

It is also critical in the instant invention to anodize in sulphuric acid in order to obtain the porous, hard, water receptive surface that is capable of being sealed. Other acids such as boric or chromic do not give the desired hardness and phosphoric and hydrofluoric acid are incapable of being sealed.

Following the graining step, the grained aluminum plate is anodized in a 5 to 30 percent aqueous sulphuric acid bath to obtain a surface covered with an anodic coating of alumina. A relatively inert material such as lead or stainless steel is used as the cathode. The cellular structure of the alumina contains pores ranging in size from about 5 to 100 angstroms in average diameter. The anodizing step is carried out at temperatures in the range 10°–40°C at current densities in the range 8 to 55 amp./ft.$^2$ for a period ranging from 1 to about 10 minutes.

The preferential adhesive property of this plate which is so important to its makeup, is controlled by the degree of seal, carried out after anodization in boiling deionized water. The anodizing conditions specified herein result typically in plates with Z scope porosities of between 0.8–3.0 kiloohms. These anodized plates without sealing result in a sharp 1 to 2 grey scale cut-off and are essentially high contrast in nature and thus inoperable as a continuous tone plate. A Z scope is an electrical instrument that measures impedance. Impedance is like resistance except AC instead of DC current is used. The value of the impedance measured by the Z scope gives information about the anodic coating, notably how porous it is, (e.g. a coating with many pores has low Z, with few pores, high Z). Z measurements herein were made in accord with the procedure set out in ASTM B457-67. Since any sealable plate will seal completely in boiling deionized water in 25 minutes, the sealing step herein is carried out in boiling, deionized water ($PO_4$ free) for periods ranging from 5–20 minutes depending upon the initial Z reading. If plates are removed before complete sealing, such that Z, values of 6–12 KΩ as measured by a Z scope are obtained, then these plates, upon imaging, display 7–9 grey scale steps of continuous tones and are operable in this invention. Thus for the instant invention it is critical that after sealing, the plate have a Z value in the range 6–12 kiloohms in order to obtain a continuous tone plate. Continuing the sealing process for more than 20 minutes in boiling deionized water results in plates with Z's of 15–100 KΩ which will not adhered our photosensitive layer and are useless for offset lithography.

Since the photopolymer cures from the top down, the addition of the cured photopolymer is adjusted by sealing the plate to an optimum level such that only where cure has proceeded to the bottom of a grain pit does the cured material remain adhered on development. If the depths of the pits cover a wide range, e.g. 1–15 microns, then the more light received by the surface, the more pits that will have polymer cured to the bottom of the pits and hence adhering. Hence an area receiving little light through a negative will have only a small amount of polymer adhered in shallow pits, giving a light grey when printed, while an area receiving much light through the negative will have a large amount of polymer adhered in shallow, medium and deep pits giving a dark grey when printed. If the distribution of pit depths is spread between the extremes a series of greys can be produced by exposing through a continuous tone negative.

In addition to the treatment of the aluminum plate by graining, sulfuric acid anodizing and sealing, it is also necessary and critical that the light sensitive composition have a low gamma in the range 0.3 to 2.5 in order to obtain a continuous tone image. By this is meant that the photosensitive composition, to be operable in this invention, must be capable of yielding a film when coated on a transparent support that can be exposed and processed to give an image having gamma in the range 0.3–2.5. Gamma is measured by exposing such a film to a ultraviolet light source through a Kodak 21 step density wedge held in contact with the film. The photosensitive material can contain a pigment or dye as described in U.S. Pat. No. 3,623,879 assigned to the same asignee. After processing, by removal of uncured photosensitive material, the optical density of each step is measured by an instrument such as a Macbeth Densitemeter Model Quanta-Log No. TD-102. By plotting log (density of the film/vs log density of the Kodak wedge) a graph is obtained the slope of the linear portion giving the value of gamma.

The following examples will serve to illustrate but expressly not limit the instant invention.

EXAMPLE 1

An aluminum substrate was prepared by graining an 18 inch × 23 inch ×12 mil sheet of aluminum electrochemically in HCl 0.4 Baume at 12°C using AC current at a voltage of 9.4 volts. The graining was carried on for 25 minutes. The grain depth variation was between 1–15 microns. The plate was removed from the graining bath, rinsed and immersed as an anode in a tank containing a 15% sulfuric acid electrolyte at a temperature of 24°C using lead as a cathode. Current was applied to the electrodes at a density of 20 amps per square foot for 1.5 minutes. The plate was removed from the anodizing bath, rinsed in phosphate free deionizing water and dried. The anodized aluminum plate had an electrical impedance of 1.9 kiloohms. The plate was then placed in boiling deionizing water ($PO_4$ free) for 15 minutes to seal the pores. The sealed plate had an electrical impedance of 8 kiloohms. The thus anodized, sealed plate was then coated with a photocurable composition, the polyene of which was made in the following manner. To a resin kettle, equipped with stirrer, Allihn (bubble) condenser, thermometer and pressure equalizing dropping funnel was added 696 grams (4.0 moles) of commercially available toluene diisocyanate. The flask was blanketed with nitrogen and heated to 60°C with stirring. 464 grams (8.0 moles) of allyl alchol was added to the kettle from the dropping funnel over a two hour period. The flask temperature was maintained at 60°–70°C by cooling for an additional two hours at which time the NCO content was measured to be 0. This allyl-terminated prepolymer will herein after be referred to as prepolymer A. A solution of 20% prepolymer A (2.0 grams) in diglyme along with 1.69 grams of pentaerythritol tetrakis ($\beta$-mercaptopropionate) commercially available from Carlisle Chemical Company under the tradename "Q-43" and 0.37 grams of dibenzosuberone having a diffuse density film gamma of 0.9 was wiped onto the sealed anodized plate until dry. The plate was then contact exposed through a continuous tone negative and gray scale for 1.5 minutes to a carbon lamp at a distance of 38 inches and thereafter swab-developed with an aqueous solution consisting of 8 parts "Triton X-100" in 100 parts of water. The lithographic plate after development contained 8 clearly defined steps on the gray scale. The plate was then printed on a Harris Model L 125 B 19 inch ×25 inch offset press using 60 pound long grain Scott offset paper. The plate gave excellent lithographic continuous tone copies.

EXAMPLE 2

An aluminum substrate was prepared by graining an 18 inches × 23 inch ×12 mil sheet of aluminum electrochemically in HCl 0.4 Baume at 12°C using AC current at a voltage of 9.4 volts. The graining was carried on for 25 minutes. The grain depth variation was between 1–15 microns. The plate was removed from the graining bath, rinsed and immersed as an anode in a tank containing a 15% sulfuric acid electrolyte at a temperature of 24°C using lead as a cathode. Current was applied to the electrodes at a density of 20 amps per square foot for 1.5 minutes. The plate was removed from the anodizing bath and rinsed in phosphate free deionizing water. The thus anodized plate had an electrical impedance of 1.9 kiloohms. The plate was then placed in boiling deionizing water ($PO_4$ free) for 15 minutes to seal the pores. The sealed plate had an electrical impedance of 8 kiloohms. The sealed plate was coated with a solution of ST Diazo from Harold M. Pitman Co., and dried. The plate was contact exposed through a continuous tone negative and a 21 step grey scale for 2 minutes to a carbon arc lamp at a distance of 36 inches and thereafter developed with Pitman's ST Super D+ developer. The lithographic plate after development contained 7 clearly defined steps on the grey scale and gave many excellent continuous tone copies when printed on a L125 Harris press.

EXAMPLE 3

Examples 1 and 2 were repeated except that the sealing step was omitted. On development that exposed portion of the photosensitive composition adhered to the plate strongly giving a normal, high contrast lithographic plate with a 3 step grey scale cut-off which is inoperable as a continuous ton plate.

EXAMPLE 4

Example 1 was repeated except that the grained plate was anodized in a 42% phosphoric acid electrolyte at a temperature of 25°C using a lead cathode at a current density of 22 amps./ft.$^2$ for 8 minutes. The electrical impedance measurement after anodization and after sealing was the same indicating that no sealing occurred. Exposure through a continuous tone negative gave unacceptable printing quality. On development a sharp grey scale cut-off of 2 steps was obtained rendering the image high contrast.

EXAMPLE 5

Example 1 was repeated except that the sealing step in boiling deionized water was carried out for 30 minutes. On development both the exposed and unexposed portion of the photosensitive composition failed to adhere to the plate.

EXAMPLE 6

Example 1 was repeated except that the graining step was carried out at 12°C., 8.0 volts AC, 0.3 Baume HCl and 4 inches separation. After 55 minutes, a very uniform grain was obtained of 7–9 micron grain depth range. After anodizing and sealing to a Z of 8 kiloohms, a high contrast plate was obtained upon imaging and development which was inoperable as a continuous tone plate.

EXAMPLE 7

Example 1 was repeated except that in the anodizing step 5% $H_2SO_4$ at 5°C was used and anodization carried out at a voltage such that 25 amps/ft.$^2$ was deposited for 25 minutes. This plate had negligible porosity and a Z before sealing of 12.8 kiloohms. The photosensitive composition would not adhere to this surface.

EXAMPLE 8

Example 1 was repeated except that the graining was done by chemical means as follows. The plate was treated at 30°C to 2% $NH_4(H)F_2$ followed by a 40°C treatment with 5% NaOH. A relatively uniform and shallow (less than 4 microns) roughened surface was obtained which after anodizing, sealing and imaging did not produce the desired continuous tone effect but rather gave a sharp grey scale cut-off of 2 steps.

What is claimed is:

1. The process of forming a sealed, anodized surface on an aluminum or aluminum alloy sheet capable of printing a continuous tone lithographic print consisting of the steps of a. electrochemically graining the surface of the sheet at a temperature in the range between 15° and 36°C using line AC current and a voltage between 8.5 and 12 volts in a bath consisting of 0.1 to 1.0 Baume HCl with a spacing between the aluminum sheets of 1–3 inches to obtain a depth variation of 1–15 microns;

b. anodizing the grained sheet in a 5–30% aqueous solution of sulphuric acid as the electrolyte at a current density in the range 8–55 amperes/ft.$^2$ at a temperature in the range 10°–40°C for a period ranging from 1–10 minutes; and c. sealing the anodized sheet in boiling deionized water until it has an electrical impedance in the range 6–12 kiloohms.

2. A method for preparing a continuous tone lithographic printing plate which comprises a. electrochemically graining the surface of an aluminum or aluminum alloy sheet at a temperature in the range between 15° and 36°C using line AC current and a voltage between 8.5 and 12 volts in a bath consisting of 0.1–1.0 Baume HCl with a spacing between the aluminum sheets between 1 and 3 inches for a period ranging up to 30 minutes to obtain a depth variation of 1–15 microns;

b. anodizing the grained sheet in a 5–30% aqueous solution of sulphuric acid as the electrolyte at a current density in the range 8–55 amperes/ft.$^2$ at a temperature in the range 10°–40°C for a period ranging from 1–10 minutes;

c. sealing the anodized sheet in boiling deionized water until it has an electrical impedance in the range 6–12 kiloohms; and d. coating the thus sealed sheet with a negative-working photosensitive material.

3. The method according to claim 2 wherein the photosensitive material is a photocurable composition capable of forming an image having a gamma in the range 0.3 to 2.5 consisting essentially of (1) 2 to 98 parts by weight of an ethylenically unsaturated polyene containing two or more reactive unsaturated carbon to carbon bonds per molecule; (2) 98 to 2 parts by weight of a polythiol containing at least 2 thiol groups per molecule, the total combined functionality of the carbon to carbon bonds per molecule in the polyene and the thiol groups per molecule in the polythiol being greater than 4 and (3) 0.0005 to 50 parts by weight based upon 100 parts by weight of (1) and (2) of a photocuring rate accelerator.

4. The method according to claim 2 wherein the photosensitive material is a diazo material capable of forming an image having a gamma in the range 0.3 to 2.5.

5. A method for preparing a continuous tone lithographic printing plate which comprises a. electrochemically graining the surface of an aluminum or aluminum alloy sheet at a temperature in the range between 15° and 36°C using line AC current and a voltage between 8.5 and 12 volrs in a bath consisting of 0.1 to 1.0 Baume HCl with a spacing between the aluminum sheets between 1 and 3 inches for a period ranging up to 30 minutes to obtain a depth variation of 1–15 microns;

b. anodizing the grained sheet in a 5–30% aqueous solution of sulphuric acid as the electrolyte at a current density in the range 8–55 amperes/ft.$^2$ at a temperature in the range 10°–40°C for a period ranging from 1–10 miinutes;

c. sealing the anodized sheet in boiling deionized water until it has an electrical impedance in the range 6–12 kiloohms;

d. coating the thus treated sheet with a negative-working photosensitive diazo material;

e. exposing said diazo material imagewise through a continuous tone, image bearing transparency to ultraviolet radiation whereby the exposed area of the diazo material is insolubilized; and f. removing the unexposed diazo material thereby uncovering portions of the sheet and forming an image having a gamma in the range 0.3–2.5.

6. A method for preparing a continuous tone lithographic printing plate which comprises a. electrochemically graining the surface of an aluminum or aluminum alloy sheet at a temperature in the range between 15° and 36°C using line AC current and a voltage between 8.5 and 12 volts in a bath consisting of 0.1 to 1.0 Baume HCl with a spacing between the aluminum sheets between 1 and 3 inches for a period ranging up to 30 minutes to obtain a depth variation of 1–15 microns;

b. anodizing the grained sheet in a 5–30% aqueous solution of sulphuric acid as the electrolyte at a current density in the range 8–55 amperes/ft.$^2$ at a temperature in the range 10°–40°C for a period ranging from 1–10 minutes;

c. sealing the anodized sheet in boiling deionized water until it has an electrical impedance in the range 6–12 kiloohms;

d. coating the thus treated sheet with a negative-working photocurable composition consisting essentially of (1) 2 to 98 parts by weight of an ethylenically unsaturated polyene containing two or more reactive unsaturated carbon to carbon bonds per molecule; (2) 98 to 2 parts by weight of a polythiol containing at least 2 thiol groups per molecule, the total combined functionality of the carbon to carbon bonds per molecule in the polyene and the thiol groups per molecule in the polythiol being greater than 4 and (3) 0.0005 to 50 parts by weight based upon 100 parts by weight of (1) and (2) of a photocuring rate accelerator, e. exposing said photocurable composition imagewise through a continuous tone, image bearing transparency to ultraviolet radiation whereby the exposed area of the photocurable composition is insolubilized; and f. removing the unexposed photocurable composition thereby uncovering portions of the sheet and forming an image having a gamms in the range 0.3–2.5.

* * * * *